United States Patent [19]

Tanaka et al.

[11] Patent Number: 5,034,339
[45] Date of Patent: Jul. 23, 1991

[54] METHOD FOR PRODUCING AMORPHOUS SILICON THIN FILM TRANSISTOR ARRAY SUBSTRATE

[75] Inventors: Sakae Tanaka; Yoshiaki Watanabe, both of Tokyo, Japan

[73] Assignee: Seikosha Co., Ltd., Tokyo, Japan

[21] Appl. No.: 383,120

[22] Filed: Jul. 19, 1989

Related U.S. Application Data

[62] Division of Ser. No. 300,629, Jan. 23, 1989, Pat. No. 4,960,719.

[30] Foreign Application Priority Data

Feb. 4, 1988 [JP] Japan ................................. 63-24729
Feb. 10, 1988 [JP] Japan ................................. 63-29181
Feb. 10, 1988 [JP] Japan ................................. 63-29182

[51] Int. Cl.$^5$ ......................................... H01L 21/283
[52] U.S. Cl. ................................... 437/40; 437/101
[58] Field of Search ............... 437/40, 41, 101; 357/2, 357/4, 23.7; 350/333

[56] References Cited

U.S. PATENT DOCUMENTS

| | | | |
|---|---|---|---|
| 4,788,157 | 11/1988 | Nakamura | 437/101 |
| 4,862,234 | 8/1989 | Koden | 357/4 |
| 4,894,690 | 1/1990 | Okabe et al. | 357/23.7 |
| 4,904,056 | 2/1990 | Castleberry | 350/333 |

FOREIGN PATENT DOCUMENTS

| | | | |
|---|---|---|---|
| 0224278 | 11/1985 | Japan | 357/23.7 |
| 0005577 | 1/1986 | Japan | 357/23.7 |

Primary Examiner—Olik Chaudhuri
Assistant Examiner—M. Wilczewski
Attorney, Agent, or Firm—Jordan and Hamburg

[57] ABSTRACT

A method for producing an amorphous silicon thin film transistor array substrate comprising successively coating a gate insulating layer, an amorphous silicon layer and a protective insulating layer on a glass substrate provided with a gate electrode and a gate wiring having a predetermined shape, in such a manner as to not cover the connecting terminal region of the gate wiring. A protective insulating layer is patterned into a predetermined shape. After passing through a predetermined production process to produce an amorphous silicon thin film transistor array, at least a gate wiring and a source wiring are provided. The step of patterning the protective insulating layer comprises covering the connecting terminals of the gate wiring and the exposed region of the glass substrate with a photoresist.

1 Claim, 7 Drawing Sheets 5,034,339

METHOD FOR PRODUCING AMORPHOUS SILICON THIN FILM TRANSISTOR ARRAY SUBSTRATE

This application is a Division of Ser. No. 300,629 Jan. 23, 1989 now U.S. Patent 4,960,719

FIELD OF THE INVENTION

The present invention relates to a method for producing an amorphous silicon (hereinafter referred to as a-Si) thin film transistor (hereinafter referred to as TFT) array substrate.

BACKGROUND OF THE INVENTION

In recent years, as a thin type picture display device, a liquid crystal matrix display device, especially a liquid crystal display device of the so-called active matrix type provided with a switching element per each pixel has been under research and development in various places. As a switching element an MIS type TFT using a-Si is mainly utilized.

FIG. 7 schematically represents an example of the circuit construction of an active matrix type liquid crystal display device using TFT.

In the scanning line 11, when Xi is selected, for example, the gates of respective TFT 13-a connected thereto are turned on all at once, and through the sources of these TFT turned on, the signal voltage corresponding to the picture information is transmitted from respective signal lines 12 to the drains of respective TFT 13-a. A pixel electrode (not shown in the Figure) is connected to the drain, and by the voltage difference between this pixel electrode and the counter electrode 15 formed on the substrate, which is on the other side, when putting the liquid crystal layer 14 between, the optical transparency of the liquid crystal layer 14 is changed to effect a picture image display. When the Xi is in a non-selective state, the gate of each TFT 13-a connected thereto is turned off, and successively, Xi+1 is selected, and the gate of each TFT 13-b is turned on, and a process similar to that as described above is effected. Even after the gate was turned off, since the voltage difference between both the pixel electrode and the counter electrode 15 is preserved by the liquid crystal layer 14 until the same scanning line is selected the next time, the liquid crystal corresponding to each pixel becomes statically driven, and a display of high contrast can be obtained.

As the a-Si TFT used in TFT 13, the TFT produced by the production method having the process of successively depositing a gate insulating layer, an a-Si layer, and a protective insulating layer is hopeful from the viewpoint of reliability, reproducibility of the production method and the like.

FIGS. 8(a) to 8(d) are diagrams schematically representing an example of the production method of the a-Si TFT used in an active matrix type liquid crystal display device, and having the above-described method of production. In the following, explanation will be given by referring to this Figure.

(a) A metal layer of Cr or the like is selectively formed by coating on a glass substrate 21, and a gate electrode 22 and gate wiring (not shown in the Figure) are formed thereon, and successively, a gate insulating layer 23 made of silicon nitride or silicon oxide, an intrinsic a-Si (hereinafter referred to as i-a-Si layer 24 containing almost no impurities which form an active layer, and a protective insulating layer 25 made of silicon nitride or silicon oxide are deposited by using, for example, a plasma CVD method.

(b) The protective insulating layer 25 is selectively etched by use of a buffer fluoric acid solution to expose the i-a-Si layer 24 such as to make a part thereof overlap on the gate electrode 22.

(c) An n-type a-Si (hereinafter referred to as an n-a-Si) layer 26 containing an appropriate amount of phosphorous and a metal layer 27 of Ti or the like are successively deposited, and the metal layer 27 is selectively etched and is patterned into the shape of source and drain electrodes, and using the metal layer 27 and the protective insulating layer 25 as a mask, the n-a-Si layer 26 and i-a-Si layer 24 are etched by use of an organic alkaline solution, and an island-like structure is formed.

(d) A transparent conductive layer 28 of ITO or the like is deposited, and by selectively removing it, a source wiring and a pixel electrode are formed.

By such processes as described above, an a-Si TFT as shown in FIG. 8(d) is completed.

The above-described explanation is mainly related to the production processes of the TFT, but in the peripheral part of the substrate, especially in the end part of the gate wiring, production was carried out by taking notice of the following points. Since the gate wiring requires to effect connection to an external circuit via the connecting terminal of the gate wiring, it must be finally exposed, but for the sake of simplifying the process, a metal mask 32 was arranged to the glass substrate 31 as shown in FIG. 9 to prevent each layer from being deposited on the connecting terminal part of the gate wiring.

When respective layers were deposited by use of a metal mask, not only on the connecting terminals but also on the peripheral glass plate, the respective layers are not deposited. Accordingly, in the TFT forming process described above, in the case of etching the protective insulating layer formed of silicon nitride or silicon oxide, the surface of the glass substrate also becomes etched at the same time. FIG. 10 schematically shows the status of the connecting terminal part at this time. Numeral 21 denotes a glass substrate, numeral 22 a gate wiring, numeral 23 a gate insulating layer, and numeral 24 an i-a-Si layer. In a conventional method, since the surface of the glass substrate is etched, there were such problems that the roughness 29 of the glass surface or the under cut 30 at the end part of the gate wiring 22 occurs. Especially, the under cut 30 causes peeling of the gate wiring 22 or the like, and was a cause of the lowering of the yield of the product.

The present invention has been carried out in view of the above-described defects, and has the main object of removing the roughness of the surface of the glass substrate or the under cut at the end part of the gate wiring or the like.

DESCRIPTION OF THE PREFERRED EMBODIMENTS

Figure 1A:
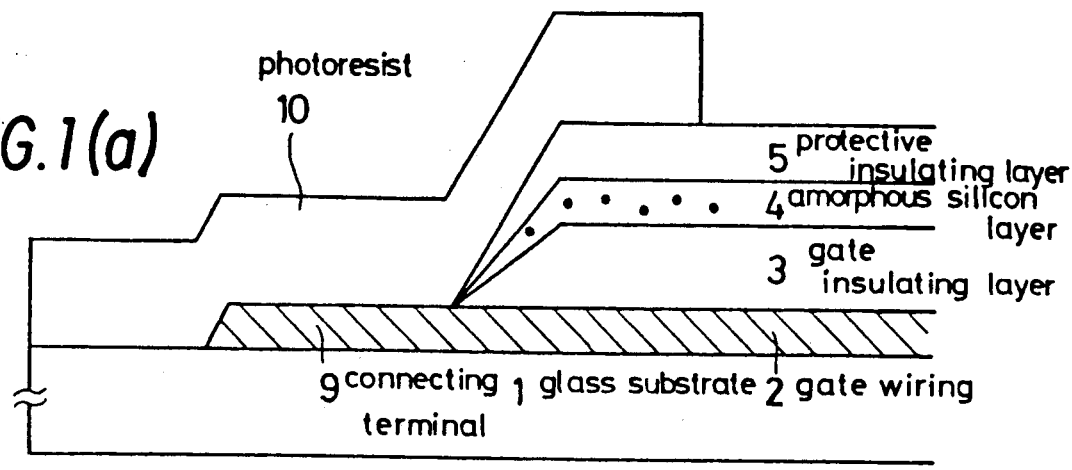
FIGS. 1(a) to 1(c) are sectional diagrams showing the production method of the first embodiment of the present invention.

In the following, an explanation will be given of various embodiments of the present invention by referring to the drawings.

Figure 1B:
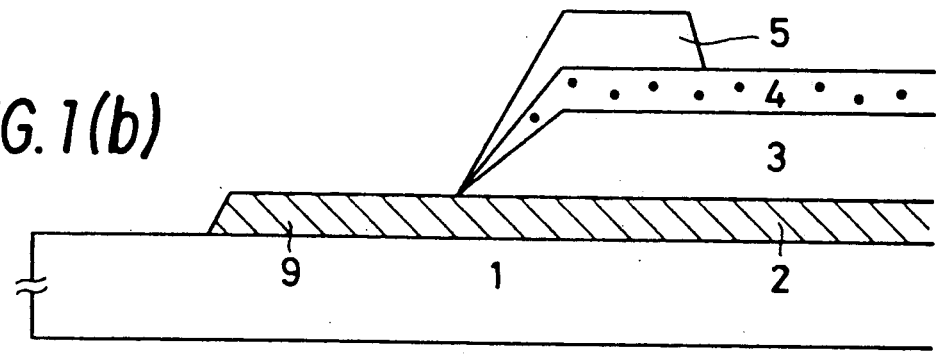

FIG. 1 is a diagram which shows the first embodiment of the present invention, and schematically shows the section of the connecting terminal part of the gate wiring.

Numeral 1 denotes a glass substrate, numeral 2 a gate wiring, numeral 3 silicon nitride or silicon oxide for forming the gate insulating layer, numeral 4 an i-a-Si layer, numeral 5 silicon nitride or silicon oxide for forming the protective insulating layer, numeral 9 a connecting terminal, and numeral 10 the photoresist.

Further, since the construction of the TFT or the production method thereof is not different than conventional TFTs, it is preferable that the disclosure of the production process of the TFT be given in the discussion of FIG. 8.

(a) Referring to FIG. 1, on the glass substrate 1 having a gate electrode (not shown in the Figure) and gate wiring 2 are deposited a gate insulating layer 3 made of silicon nitride or silicon oxide, the i-a-Si layer 4, and a protective insulating layer 5 made of silicon nitride or silicon oxide by using a metal mask to mask the connecting terminal part of the gate wiring 2, and for example, by means of the plasma CVD method. Successively, the photoresist is applied thereon to form a pattern of a predetermined shape as the etching mask of the protective insulating layer 5 in exposing the i-a-Si layers of the source and drain parts of the TFT. At this time, the connecting terminal part of the gate wiring 2 is also covered with the photoresist 10 at the same time.

Further, it is preferable that the photoresist pattern of the TFT part and the photoresist pattern of the connecting terminal part are formed by using the same photomask.

(b) By using the above-described photoresist pattern as a mask, the protective insulating layer is etched by use of a buffer fluoric acid solution. At this time, since the glass surface of the connecting terminal part of the gate wiring 2 is covered with the photoresist 10, it is not invaded in any way by the buffer fluoric acid solution. After finishing the etching, the photoresist is peeled off.

(c) An n-a-Si layer (not shown in the Figure) and a metal layer (not shown in the Figure) are successively deposited, and the metal layer is patterned into the shapes of source and drain electrodes, and using these as the mask, the n-a-Si layer and the i-a-Si layer 4 are etched by use of an organic alkaline solution. Finally, a transparent conductive layer of ITO or the like is deposited, and by selectively removing this layer, a source wiring and a pixel electrode are formed.

Figure 1C:
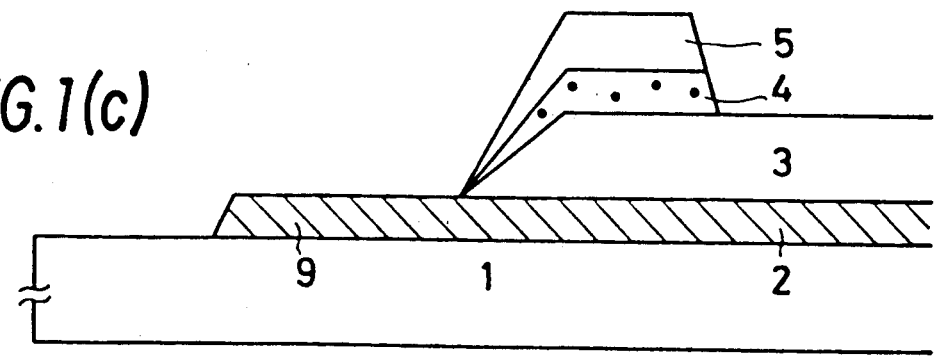

By the process as described above, the connecting terminal part of the gate wiring 2 can be obtained without the roughness due to the etching of the surface of the glass substrate as shown in FIG. 1(c).

Next, the second embodiment of the present invention will be explained by referring to FIG. 2.

Figure 2A:
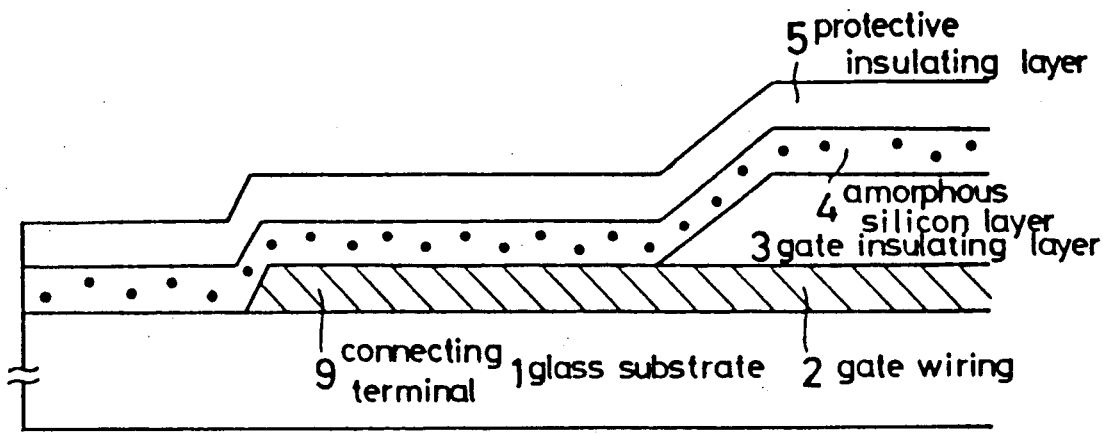
FIGS. 2(a) to 2(c) are sectional diagrams showing the second embodiment.
Figure 2B:
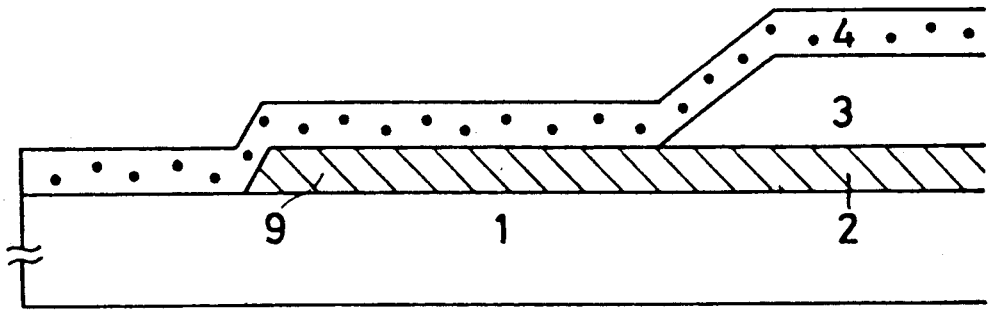

In FIG. 2, numeral 1 denotes a glass substrate, numeral 2 a gate wiring, numeral 3 silicon nitride or silicon oxide for forming a gate insulating layer, numeral 4 an i-a-Si layer, numeral 5 silicon nitride or silicon oxide for forming a protective insulating layer, and numeral 9 a connecting terminal.

Since the construction of the TFT or the production method thereof is not different from that of conventional TFTs, the production process of the TFT will be explained with reference to FIG. 8.

(a) Referring to FIG. 2, on the glass substrate 1 having a gate electrode (not shown in the Figure) and a gate wiring 2, silicon nitride or silicon oxide for forming a gate insulating layer 3 is deposited by using a metal mask to mask the connecting terminal part of the gate wiring 2, and successively, an i-a-Si layer 4 is deposited on the whole surface without using a metal mask, and further, silicon nitride or silicon oxide for forming a protective insulating layer 5 is deposited on the whole surface of the substrate without using a metal mask.

For the deposition of the above-described three layers, the plasma CVD method is suitable. Also, the protective insulating layer 5 may be deposited by use of a metal mask.

(b) The protective insulating layer 5 is etched by use of a buffer fluoric acid solution. At this time, since the i-a-Si layer 4 is covering the whole substrate, the connecting terminal 9 of the gate wiring and the glass substrate 1 is entirely not invaded by the buffer fluoric acid solution.

Figure 8A:
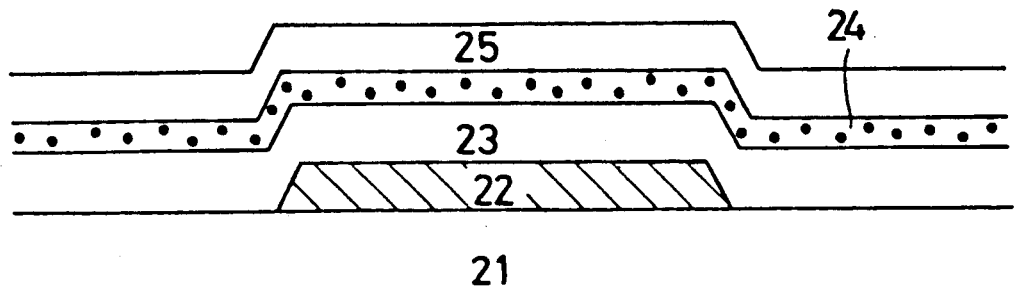
FIGS. 8(a) to 8(d) are sectional diagrams showing one example of the production process of the amorphous silicon thin film transistor.
Figure 8B:
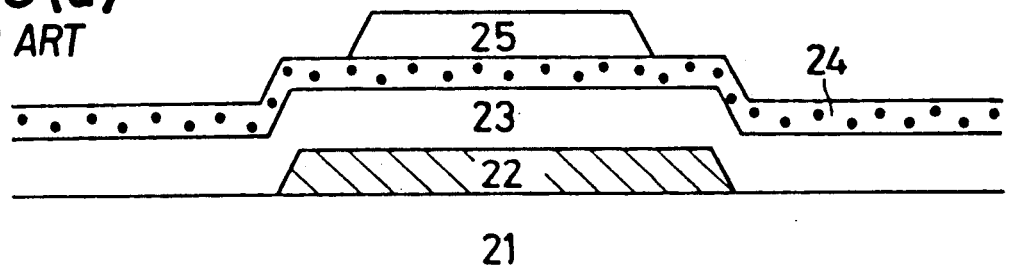
Figure 8C:
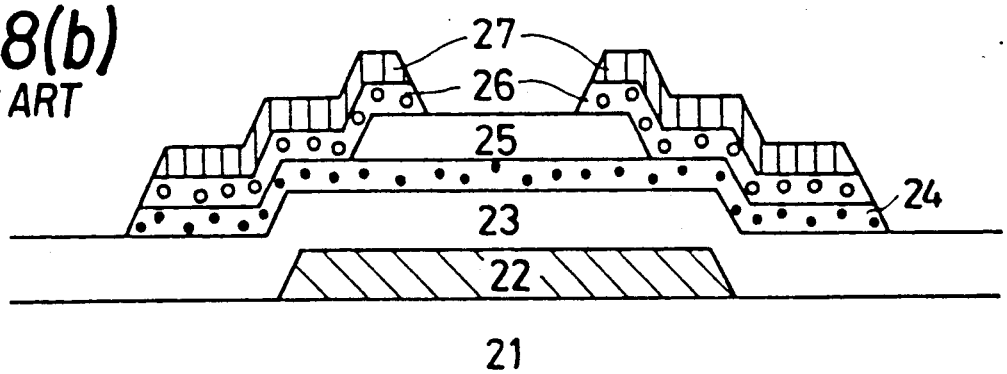
Figure 8D:
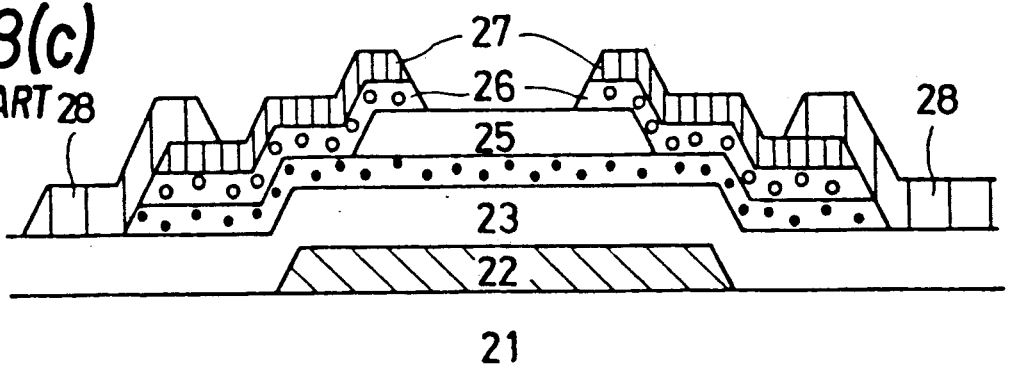
Figure 9:
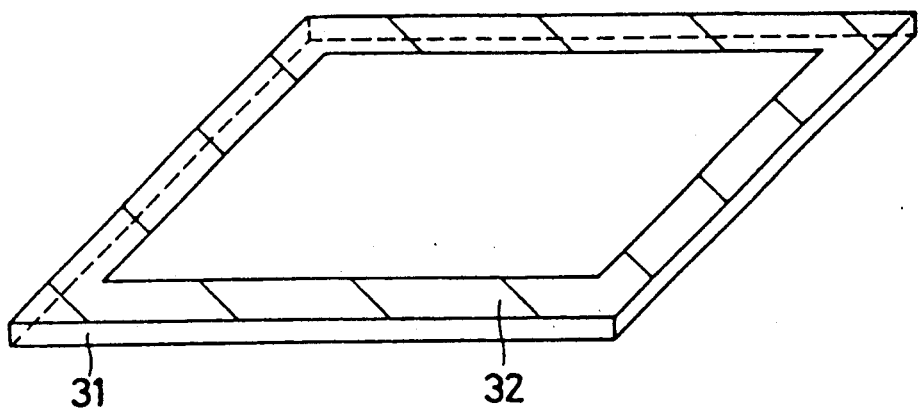
FIG. 9 is a perspective diagram showing the relationship between the glass substrate and the metal mask.
Figure 10:
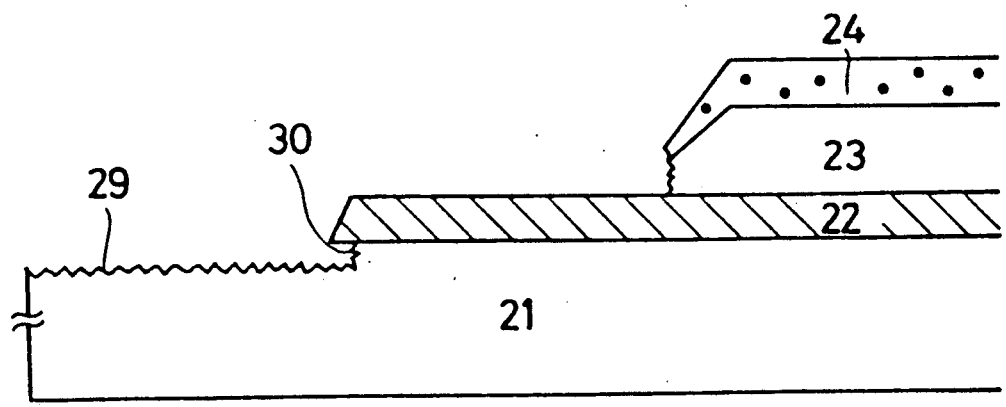
FIG. 10 is a sectional diagram showing the connecting terminal part of the gate wiring in a conventional production method.

(c) An n-a-Si layer 26 (FIG. 8(c)) and a metal layer 27 (FIG. 8(c)) are successively deposited, and the metal layer is patterned into the shapes of source and drain electrodes, and by making the pattern of the above-described metal layer and protective insulating layer as the mask, the n-a-Si layer and the i-a-Si layer are etched by use of an organic alkaline solution. At this time, since the i-a-Si layer 4 which was covering the connecting terminal part of the gate wiring is also removed at the same time, the connecting terminal 9 of the gate wiring is exposed. Finally, a transparent conductive layer of ITO or the like is deposited, and by selectively removing this layer, a source wiring and a pixel electrode are formed.

Figure 2C:
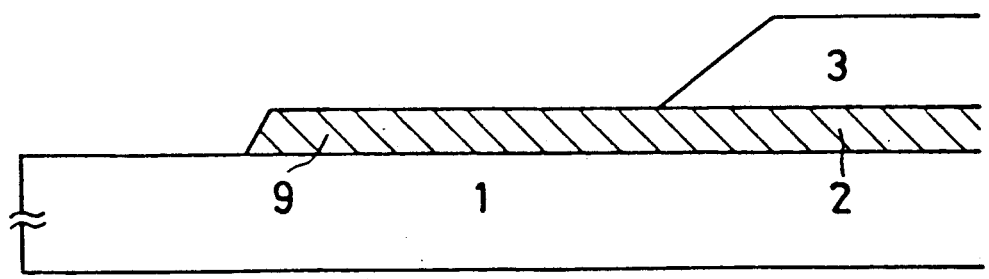

By such a process, the connecting terminal part of the gate wiring can be obtained without the roughness or the like due to the etching of the surface of the glass substrate as shown in FIG. 2(c).

Next, the third embodiment of the present invention will be explained by referring to FIG. 3.

Numeral 1 denotes a glass substrate, numeral 2 a gate insulating layer, numeral 3 silicon nitride or silicon oxide for forming a gate insulating layer, numeral 4 an i-a-Si layer, numeral 5 silicon nitride or silicon oxide for forming a protective insulating layer. Numeral 7 denotes a metal layer, and numeral 8 a transparent conductive layer, and the connecting terminal 9 of the gate wiring is constituted of these latter layers.

The production processes of the TFT of FIGS. 3(a) to (d) correspond to the production process of the TFT shown in FIGS. 8(a) to 8(d). Therefore, the following explanation will apply to FIG. 3 and FIG. 8, but in the case of applying to FIG. 8, parenthesis ( ) are applied to the numerals of FIG. 8.

(a) On the glass substrate 1 (21) having a gate electrode (22) and a gate wiring 2 is deposited silicon nitride or silicon oxide for forming a gate insulating layer 3 (23) on the whole surface of the glass substrate 1 (21), and successively, an i-a-Si layer 4 (24) and silicon nitride or silicon oxide for forming a protective insulating layer 5 (25) is deposited thereon not to cover the pattern end part of the gate wiring 2 by use of a metal mask.

Further, the protective insulating layer 5 (25) is not necessarily deposited by use of a metal mask. For accumulating the above-described three layers, the plasma CVD method is suitable.

(b) The protective insulating layer 5 (25) is selectively removed by use of a buffer fluoric acid solution, and the i-a-Si layer (24) is exposed to overlap to at least a part of the pattern of the gate electrode 2, and at the same time, an opening part 5a is provided in the inside of the pattern of gate wiring 2 such that a part of the gate wiring 2 is exposed to the gate insulating layer 3 of the part where the i-a-Si layer of the pattern end part of the gate wiring 2 is not deposited. At this time, since the surface of the glass substrate 1 is not exposed, it is entirely not invaded by the buffer fluoric acid solution.

(c) The n-a-Si layer (26) is deposited by the plasma CVD method by use of a metal mask similar to the one described above, and successively, a metal layer 7 (27) of Ti or the like is vapor deposited on the whole surface of the glass substrate 1 (21) and by selectively etching the metal layer 7 (27), a pattern of the source and drain electrode shape is formed at the TFT, and at the same time, in the region of the above-described opening part, a pattern for making connection to the gate wiring 2 is formed. Successively, by using the pattern formed by the above-described metal layer 7 (27) and the pattern of the protective insulating layer 5 (25) as the mask, the n-a-Si layer (26) is etched with an organic alkaline solution.

(d) A transparent conductive layer 8 (28) of ITO or the like is vapor deposited on the whole surface of the glass substrate 1 (21), and by selectively etching this layer 8, a source wiring and a pixel electrode are formed, and at the same time, on the pattern formed with the metal layer 7 on the above-described opening part 5a, is formed the connecting terminal 9 to the external circuit of the gate wiring 2 formed with the transparent conductive layer 8.

Figure 3A:
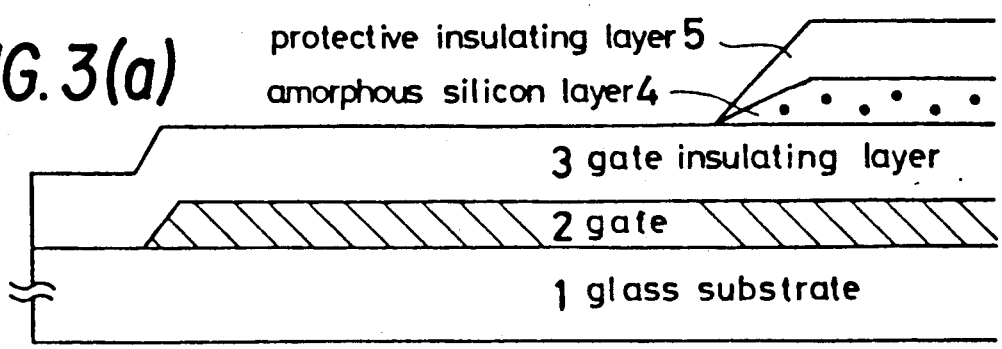
FIGS. 3(a) to 3(d) are sectional diagrams showing the third embodiment.
Figure 3B:
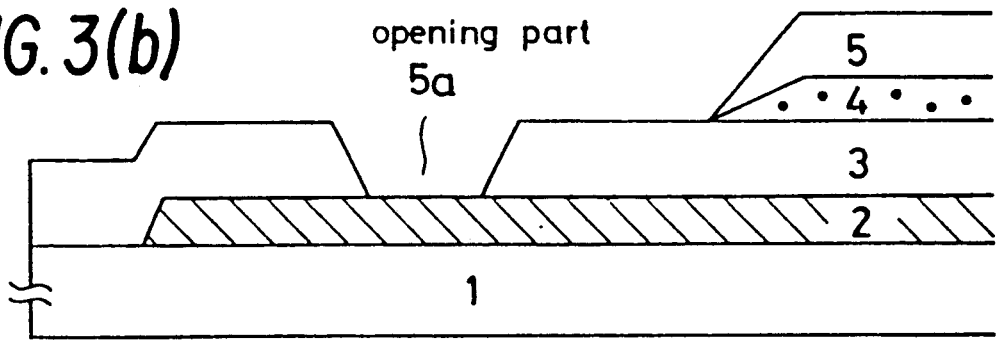
Figure 3C:
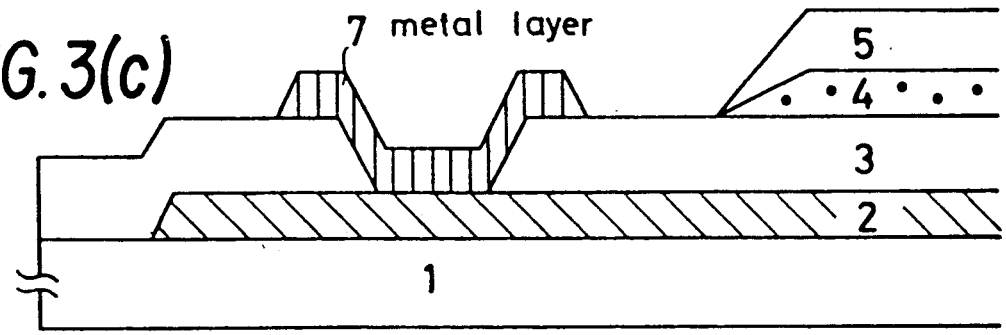
Figure 3D:
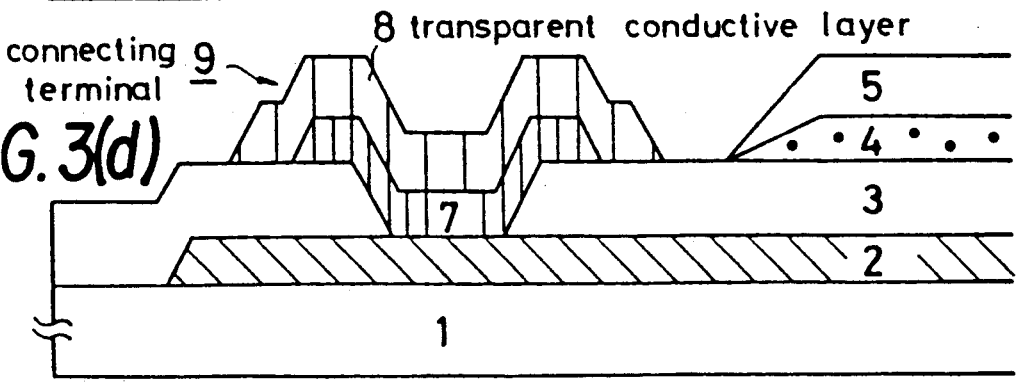

By the above-described procedures, the TFT is completed, and together with that, the connecting terminal 9 formed with the transparent conductive layer 8 to the external circuit of the gate wiring 2 as shown in FIG. 3(d) is completed.

Figure 4:
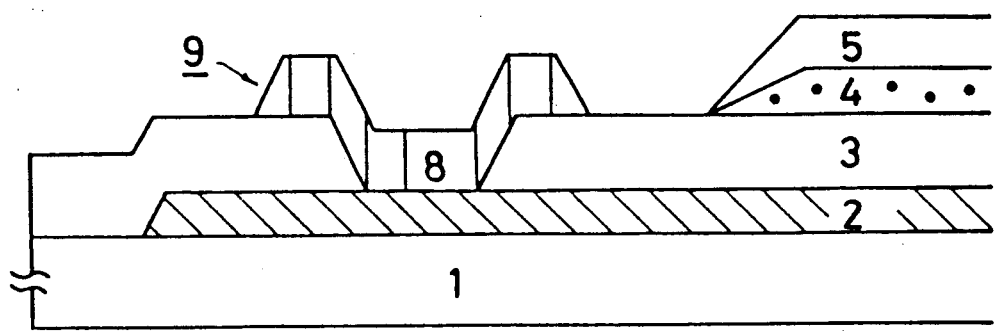
FIG. 4 is a sectional diagram showing the fourth embodiment.

FIG. 4 is a sectional diagram in the neighborhood of the gate wiring end part showing the fourth embodiment of the present invention.

This is a case in which the following points are changed in comparison with the above-described third embodiment, and in relation to other points, conditions are the same as in the third embodiment. That is, in the process (c) in the third embodiment, the pattern of the metal layer at the region of the opening part is not formed, but in the process (d), the pattern of the transparent conductive layer 8 in the opening part is directly connected to the gate wiring 2, and the connecting terminal 9 was formed.

Figure 5:
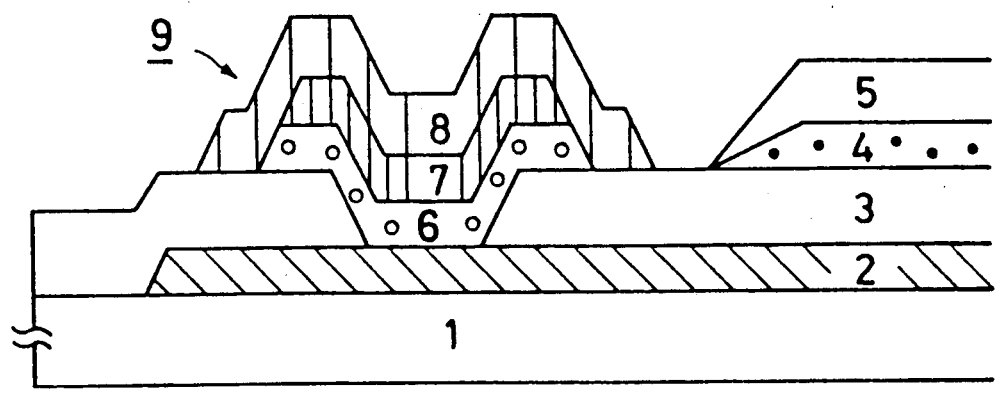
FIG. 5 is a sectional diagram showing the fifth embodiment.

FIG. 5 is a sectional diagram of the neighbourhood of the end part of the gate wiring showing the fifth embodiment of the present invention.

This is the case in which following points are changed in comparison with the above-described third embodiment, and in relation to the other points, conditions are the same as in the third embodiment. That is, a part of the process (c) of the third embodiment is changed, and the n-a-Si layer 6 is deposited on the whole surface of the glass substrate 1, and successively, the metal layer 7 of Ti or the like is vapor deposited on the whole surface of the glass substrate 1, and in the opening part region, the connecting terminal 9 made of the n-a-Si layer 6, metal layer 7, and the transparent conductive layer 8 is formed.

Figure 6:
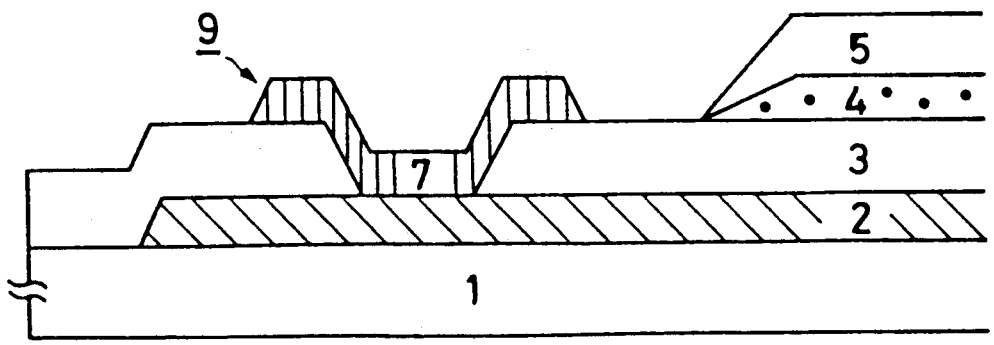
FIG. 6 is a sectional diagram showing the sixth embodiment.
Figure 7:
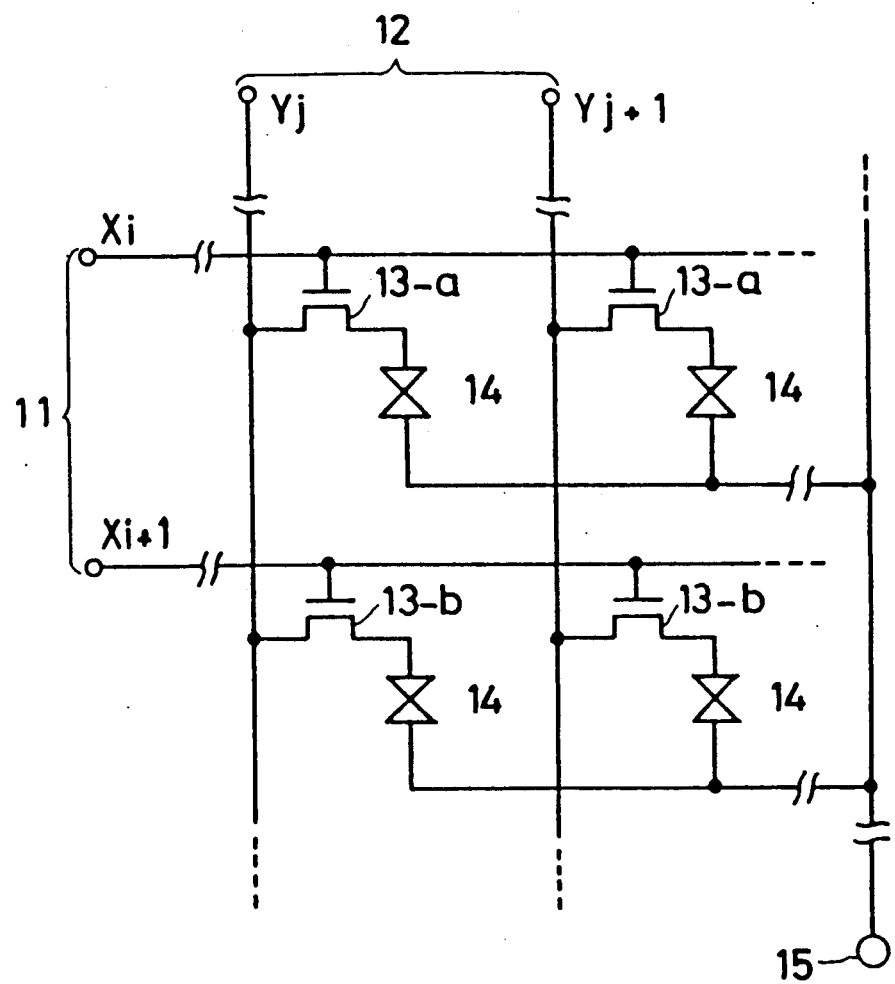
FIG. 7 is an electric circuit diagram showing the principle of the active matrix type liquid crystal display device.

FIG. 6 is a sectional diagram of the neighbourhood of the end part of the gate wiring showing the sixth embodiment of the present invention. In contrast, in the above-described third, fourth, and fifth embodiments, the conductive layer for forming the connecting terminal of the gate wiring was the transparent conductive layer to be used as the source wiring, whereas in the sixth embodiment, it is different from the above-described three embodiments in the point that the metal layer used in the case of forming the shape of the source and drain electrodes are used. More concretely, the following points are changed in contrast to the above-described embodiments and in the other points, conditions are the same as in the third embodiment. That is, in the process (d) in the third embodiment, the pattern of the transparent conductive layer in the opening part region is not formed, and as described above, the connecting terminal 9 of the gate wiring was made of the metal layer 7.

In the above description, although an explanation has been given of six embodiments, in either case, there is no problem of being invaded by the buffer fluoric acid solution in any way in removing the protective insulating layer by use of a buffer fluoric acid solution, since the surface of the glass substrate is not exposed.

Also, as can be seen from the above-described embodiments, the above-described effects can be attained only, in contrast to the conventional methods, due to the fact that the mask pattern was changed and the presence or not of the metal mask at the time of depositing each layer was changed.

In either embodiment, concerning the production processes of the TFT, although the one shown in FIG. 8 was referred to, it is needless to say that the present invention is not limited to one having the above-described production process.

As described above, according to the present invention, production can be carried out without the surface of the glass substrate in the neighbourhood of the end part of the gate wiring being entirely invaded by an etching substance. Therefore, there occurs no roughness of the surface of the glass substrate caused by the etching of the glass substrate, nor peeling off of the gate wiring due to the under cut in the end part of the gate wiring, or the like, so that the method can contribute to the improvement of the yield of products.

The method in which the gate insulating layer, amorphous silicon layer, and protective insulating layer are successively coated such as not to cover the connecting terminal part of the gate wiring, and the exposed regions of the connecting terminal of the gate wiring and the glass substrate are covered with the photoresist in the case of patterning the protective insulating layer, has the effect as described in the following. In case the photoresist is coated in the same process as that of the photoresist used in the case of exposing the amorphous silicon layer of the source and drain region, it is only necessary to change the pattern of the photomask, and there is no increase of the production process.

The method in which the gate insulating layer is deposited not to cover the connecting terminal part of the gate wiring, and the amorphous silicon layer to cover the connecting terminal part of the gate wiring, and at the time of patterning the above-described amorphous silicon layer, the amorphous silicon layer covering the connecting terminal part of the above-described gate wiring is removed, has the following effect. Since the amorphous silicon layer is deposited without using a metal mask, the film thickness distribution becomes more uniform in comparison with that in the case of using a metal mask to improve the stability and reproducibility of the transistor characteristics. Also, since this effect can be attained only by the presence of the metal mask at the time of depositing the gate insulating layer and the amorphous silicon layer, an increase of the production process is not caused.

The method in which the gate insulating layer is deposited on the whole surface of the glass substrate, and the amorphous silicon layer is selectively deposited not to cover the end part of the gate wiring pattern, and in the case of removing the protective insulating layer, a part of the gate wiring is exposed by providing an opening part in the gate insulating layer on the gate wiring of the part where the amorphous silicon layer of the gate wiring pattern end part is not coated, and further, a conductive layer for forming the connecting terminal of the gate wiring is formed on the above-described opening part, has the following effect. Since the gate insulating layer is deposited without the use of a metal mask, such defective parts as are called pinholes or weak points formed by the generation of dust accompanying the use of a metal mask are decreased, and since the probability of the occurrence of the insulation breakdown between the gate and source, between the gate and the drain, and between the gate wiring and source wiring is reduced, the method contributes to the improvement of the yield. Also, by forming the conductive layer for the connecting terminal of the gate wiring in the same process as that of the source and drain electrodes or that of the source wiring, the effect of the method can be attained, in comparison with the conventional production procedures, by only changing the mask pattern or by changing the presence or not of the metal mask at the time of depositing each layer.

What is claimed is:

1. In a method for producing an amorphous silicon thin film transistor array substrate comprising successively coating a gate insulating layer, an amorphous silicon layer, and a protective insulating layer on a glass substrate provided with a gate electrode and a gate wiring having predetermined shape, the gate wiring having an end and a terminal at said end for connecting said array to an external circuit, patterning said amorphous silicon layer, and then after passing through a predetermined production process providing at least an amorphous silicon array, a gate wiring, and a source wiring, the improvement wherein said step of coating said gate insulating layer comprises depositing said gate insulating layer to not cover said terminal region at the end of said gate wiring and said step of coating said amorphous silicon layer comprises depositing said amorphous silicon to cover the terminal region of the gate wiring, and further comprising removing the amorphous silicon layer covering the connecting terminal region at the end of said gate wiring when patterning said amorphous silicon layer.

* * * * *